United States Patent
Park et al.

(10) Patent No.: US 7,906,206 B2
(45) Date of Patent: Mar. 15, 2011

(54) ORGANIC INSULATOR COMPOSITION COMPRISING HIGH DIELECTRIC CONSTANT INSULATOR DISPERSED IN HYPERBRANCHED POLYMER AND ORGANIC THIN FILM TRANSISTOR USING THE SAME

(75) Inventors: Jong Jin Park, Guri-si (KR); Hyun Jung Park, Seoul (KR); Bon Won Koo, Suwon-si (KR); Sang Yoon Lee, Seoul (KR); Lyong Sun Pu, Suwon-si (KR); Kakimoto Masaaki, Tokyo (JP)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1059 days.

(21) Appl. No.: 11/204,102

(22) Filed: Aug. 16, 2005

(65) Prior Publication Data

US 2006/0180809 A1    Aug. 17, 2006

(30) Foreign Application Priority Data

Feb. 16, 2005    (KR) ........................ 10-2005-0012627

(51) Int. Cl.
  *B32B 5/16*    (2006.01)
  *C08K 5/00*    (2006.01)
  *H01L 51/30*    (2006.01)
(52) U.S. Cl. ............ 428/323; 524/265; 524/504; 257/40
(58) Field of Classification Search .......... 524/265–268, 524/401, 403, 408, 413, 428, 430, 436–437, 524/443, 504; 528/63; 257/40, E51.001–E51.052; 438/99; 428/323, 325, 327, 329, 331
See application file for complete search history.

(56) References Cited

U.S. PATENT DOCUMENTS

| | | | | |
|---|---|---|---|---|
| 3,660,328 A | * | 5/1972 | Lindquist, Jr. | 524/145 |
| 4,683,275 A | * | 7/1987 | Kato et al. | 526/262 |
| 5,993,967 A | * | 11/1999 | Brotzman et al. | 428/407 |
| 6,033,781 A | * | 3/2000 | Brotzman et al. | 428/405 |
| 6,140,525 A | * | 10/2000 | Okawa et al. | 556/434 |
| 6,307,081 B1 | * | 10/2001 | Takiuchi et al. | 556/434 |
| 6,344,660 B1 | | 2/2002 | Dimitrakopoulos et al. | |

(Continued)

FOREIGN PATENT DOCUMENTS

| | | | |
|---|---|---|---|
| JP | 2002080597 A | * | 3/2002 |
| JP | 2005105193 A | * | 4/2005 |
| WO | WO 2004074177 A1 | * | 9/2004 |

OTHER PUBLICATIONS

Yamanaka, K., et al. "Preparation of Hyperbranched Aromatic Polyimide Without Linear Units by End-Capping Reaction." Macromol., vol. 34 (2001): pp. 3910-3915.*

(Continued)

*Primary Examiner* — Matthew W Such
(74) *Attorney, Agent, or Firm* — Harness, Dickey & Pierce, PLC

(57) ABSTRACT

An organic insulator composition comprising a high dielectric constant insulator dispersed in a hyperbranched polymer and an organic thin film transistor using the insulator composition. More specifically, the organic thin film transistor comprises a substrate, a gate electrode, a gate insulating layer, a source electrode, a drain electrode and an organic semiconductor layer wherein the gate insulating layer is made of the organic insulator composition. The use of the insulator composition in the formation of a gate insulating layer allows the gate insulating layer to be uniformly formed by spin coating at room temperature, as well as enables fabrication of an organic thin film transistor simultaneously satisfying the requirements of high charge carrier mobility and low threshold voltage.

12 Claims, 2 Drawing Sheets

U.S. PATENT DOCUMENTS

| | | | |
|---|---|---|---|
| 6,344,662 B1 | 2/2002 | Dimitrakopoulos et al. | |
| 6,586,791 B1 | 7/2003 | Lee et al. | |
| 6,656,641 B1* | 12/2003 | Kumar | 429/305 |
| 2005/0090015 A1* | 4/2005 | Hartmann-Thompson | 436/166 |
| 2005/0137281 A1* | 6/2005 | Voss-Kehl et al. | 523/160 |
| 2006/0171870 A1* | 8/2006 | Qi et al. | 423/265 |
| 2006/0228549 A1* | 10/2006 | Kakimoto et al. | 428/402 |
| 2007/0199729 A1* | 8/2007 | Siegel et al. | 174/73.1 |
| 2007/0246245 A1* | 10/2007 | Ahn et al. | 174/126.2 |

OTHER PUBLICATIONS

Yang, G., et al. "Successful Thermal Self-Polycondensation of AB2 Monomer to Form Hyperbranched Aromatic Polyamide." Macromol., vol. 31 (1998): pp. 5964-5966.*

Takeuchi, M., et al. "Preparation of Hyperbranched Aromatic Poly(ethersulfone)s Possessing Sulfonic Acid Terminal Groups for Polymer Electrolyte." Chem. Lett., vol. 32 (2003): pp. 242-243.*

* cited by examiner

ORGANIC INSULATOR COMPOSITION COMPRISING HIGH DIELECTRIC CONSTANT INSULATOR DISPERSED IN HYPERBRANCHED POLYMER AND ORGANIC THIN FILM TRANSISTOR USING THE SAME

This non-provisional application claims priority under 35 U.S.C. §119(a) on Korean Patent Application No. 2005-12627 filed on Feb. 16, 2005, which is herein expressly incorporated by reference.

BACKGROUND OF THE INVENTION

1. Field of the Invention

Embodiments of the present invention relate to an organic insulator composition comprising a high dielectric constant insulator dispersed in a hyperbranched polymer, and an organic thin film transistor using the insulator composition. More particularly, embodiments of the present invention relate to an organic thin film transistor comprising a substrate, a gate electrode, a gate insulating layer, a source electrode, a drain electrode and an organic semiconductor layer wherein the gate insulating layer is made of an organic insulator composition comprising a high dielectric constant insulator dispersed in a hyperbranched polymer.

2. Description of the Related Art

General organic thin film transistors (OTFTs) comprise a substrate, a gate electrode, a gate insulating layer, source/drain electrodes, and a channel layer. Organic thin film transistors can be classified into bottom-contact (BC) OTFTs wherein an organic semiconductor layer is formed on source and drain electrodes, and top-contact (TC) OTFTs wherein metal electrodes are formed on an organic semiconductor layer by mask deposition.

Inorganic semiconductor materials, such as silicon (Si), have been commonly used as materials for organic semiconductor layers of OTFTs. However, with increasing demand for the manufacture of large-area, flexible displays at reduced costs, organic semiconductor materials are currently used as materials for organic semiconductor layers rather than inorganic semiconductor materials involving high costs and requiring high-temperature vacuum processes.

Organic thin film transistors are expected to be useful for driving devices of active displays and plastic chips for use in smart cards and inventory tags. The performance of such organic thin film transistors is evaluated in terms of their charge carrier mobility, threshold voltage, driving voltage and the like, and is comparable to that of α-Si TFTs.

Use of high dielectric constant insulators as materials for gate insulating layers is required to fabricate organic thin film transistors having superior electrical properties, including high charge carrier mobility. In this connection, U.S. Pat. Nos. 6,344,660 and 6,344,662 disclose thin film transistors using high dielectric constant insulators as materials for gate insulating layers. However, since the prior art devices are mainly dependent on vacuum processes for the formation of thin films, the fabrication of the devices incurs considerable costs.

U.S. Pat. No. 6,586,791 discloses an organic thin film transistor using a gate insulating layer made of nanometer-scale ceramic particles (200 nm or below) dispersed in a polymer matrix. At this time, a linear polymer, e.g., epoxy, polyimide or polyetherimide, is used as the polymer matrix for dispersing the ceramic particles. However, since the linear polymer has a relatively high viscosity in relation to its molecular weight, it has a problem of non-uniform coating.

OBJECTS AND SUMMARY

Therefore, embodiments of the present invention have been made in view of the above problems, and it is an object of embodiments of the present invention to provide an organic thin film transistor using an organic insulator composition that can be spin-coated at room temperature, and simultaneously satisfying the requirements of high charge carrier mobility and low threshold voltage.

In accordance with one aspect of embodiments of the present invention for achieving the above object, there is provided an organic insulator composition comprising a high dielectric constant insulator dispersed in a hyperbranched polymer.

In accordance with another aspect of embodiments of the present invention, there is provided an organic thin film transistor comprising a substrate, a gate electrode, a gate insulating layer, a source electrode, a drain electrode and an organic semiconductor layer wherein the gate insulating layer is made of the organic insulator composition.

BRIEF DESCRIPTION OF THE DRAWINGS

The above and other objects, features and other advantages of embodiments of the present invention will be more clearly understood from the following detailed description taken in conjunction with the accompanying drawings, in which.

DETAILED DESCRIPTION OF THE PREFERRED EMBODIMENTS

Embodiments of the present invention will now be described in more detail with reference to the accompanying drawings.

Figure 1:
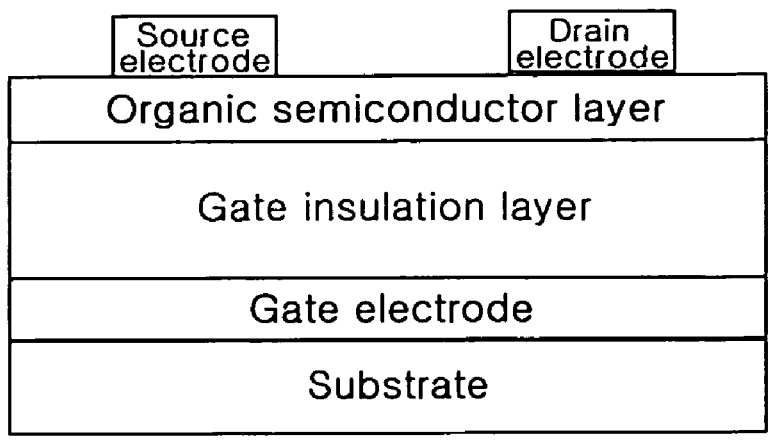
FIG. 1 is a schematic cross-sectional view showing the structure of an organic thin film transistor fabricated according to one embodiment of the present invention.

FIG. 1 is a schematic cross-sectional view showing the structure of an organic thin film transistor fabricated according to one embodiment of the present invention. Referring to FIG. 1, the organic thin film transistor of embodiments of the present invention may be comprised of a substrate, a gate electrode, a gate insulating layer, a source electrode, a drain electrode, and an organic semiconductor layer. Organic thin film transistors of embodiments of the present invention are characterized in that the gate insulating layer may be formed of an organic insulator composition comprising a high dielectric constant insulator dispersed in a hyperbranched polymer in order to improve the electrical properties of the device and facilitate the formation of the insulating layer into a thin film.

The hyperbranched polymer used in the insulator composition of embodiments of the present invention may be an amorphous material with low viscosity and low density despite high molecular weight due to its structural characteristics. Generally, although larger amounts of fillers are contained in the hyperbranched polymer than in linear polymeric structures, the hyperbranched polymer advantageously shows superior spin coating characteristics.

Comparison of physical properties of various polymeric structures

|  | Linear | Branched | Dendrimer | Crosslinked |
|---|---|---|---|---|
| Examples | PP, PS, PVC, PMMA | LDPE, Starch | — | Urea, Epoxy, Phenol resin |
| Solubility | Soluble | Soluble | Highly soluble | Poor |
| Specific gravity | High | Average | Low | High |
| Terminal number | 2 | Several | Very large | ? |

As is evident from the above table, the utilization of the characteristics of branched polymers having at least three terminal groups eliminates the necessity of the formation of successive generations, e.g., in dendrimer polymers. That is, branched polymers are advantageous due to their inherent polymeric structures in terms of easy preparation and utilization of physical properties of general polymers.

Embodiments of the present invention are based on the characteristics of hyperbranched polymers. According to embodiments of the present invention, an excess of the high dielectric constant insulator may be dispersed in the hyperbranched polymer so as to cap the surface of the insulator with the polymer. The use of the insulator composition as a material for the gate insulating layer allows the fabrication of an organic thin film transistor having improved electrical properties, and at the same time, facilitates the formation of the gate insulating layer by spin coating at room temperature based on the low density characteristics of the insulator composition.

The hyperbranched polymer used in the insulator composition of embodiments of the present invention is selected from, but not limited to, a polysiloxane polymer of Formula 1 and polymers of Formulae 3 through 13 below. As used herein, it should be understood that "Ar" denotes an aryl group.

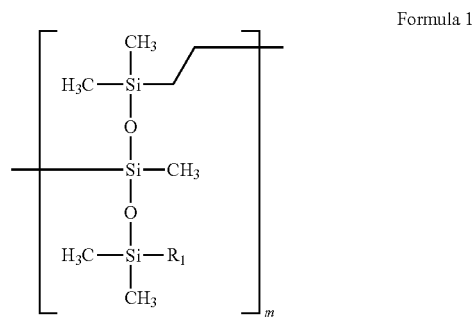

Formula 1 wherein m is an integer from 50 to 1,000, and
$R_1$ is selected from groups represented by Formula 2 below:

Formula 2 wherein n is an integer between 1 and 20, $R_2$ and $R_3$ are each a $C_{1-20}$ alkyl group, and X is F, Cl or Br;

Formula 3

-continued
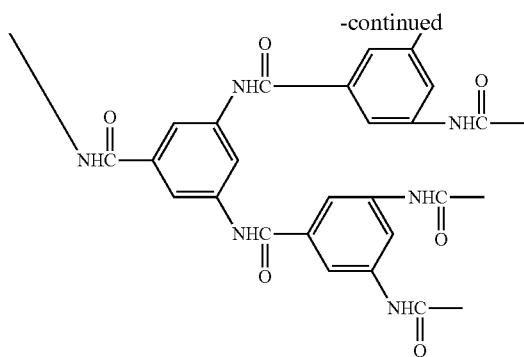
wherein n is an integer between 50 and 1,000;
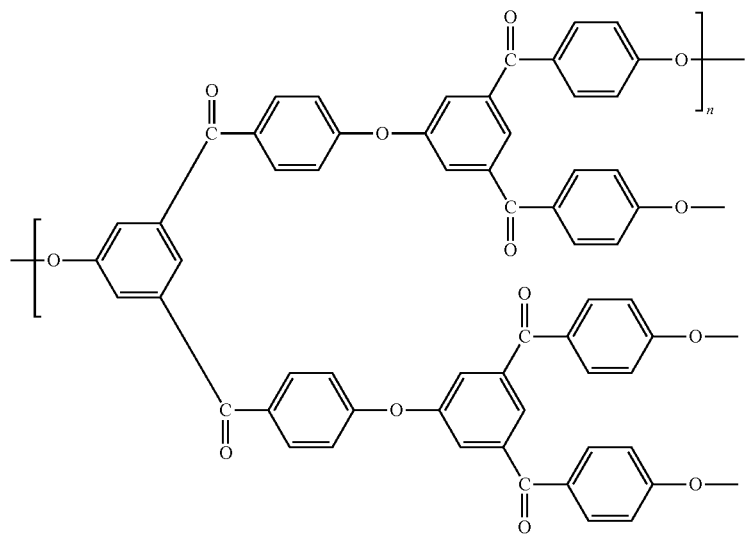
Formula 4
wherein n is an integer between 50 and 1,000;
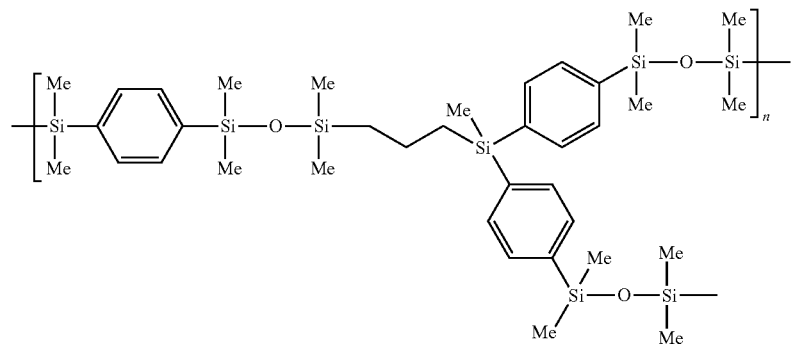
Formula 5
wherein n is an integer between 50 and 1,000;

Formula 6

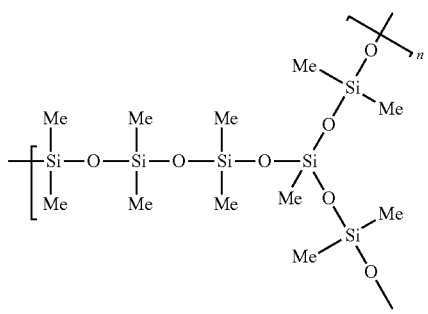

wherein n is an integer between 50 and 1,000;

Formula 7

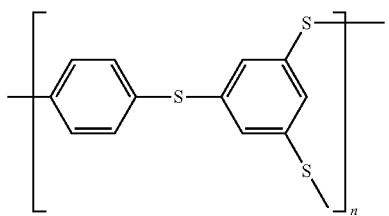

wherein n is an integer between 50 and 1,000;

Formula 8

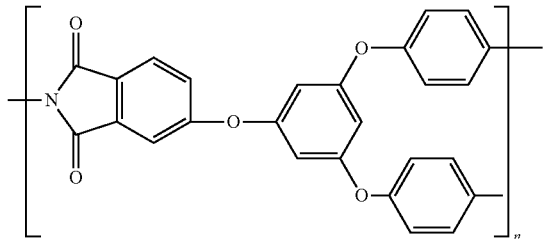

wherein n is an integer between 50 and 1,000;

Formula 9

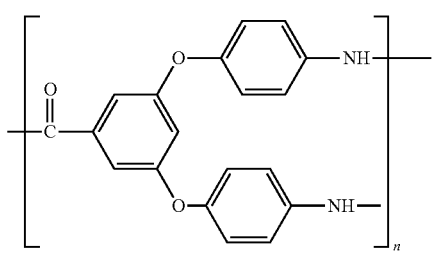

wherein n is an integer between 50 and 1,000;

Formula 10

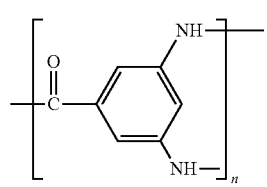

wherein n is an integer between 50 and 1,000;

Formula 11

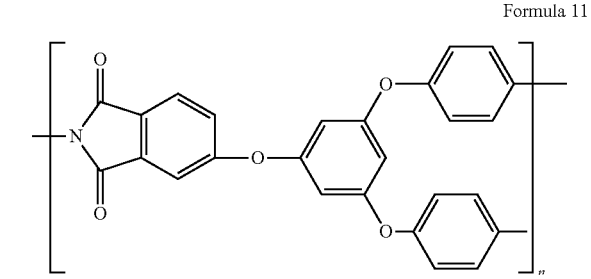

wherein n is an integer between 50 and 1,000;

Formula 12

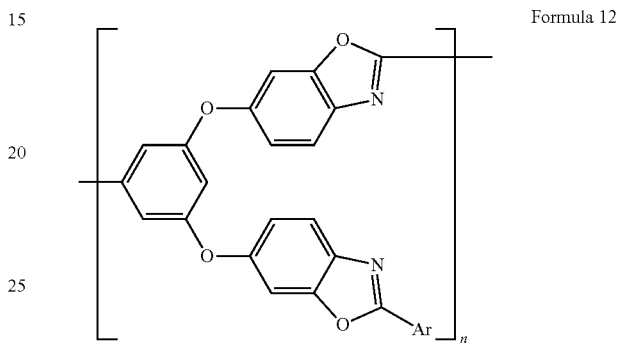

wherein n is an integer between 50 and 1,000; and

Formula 13

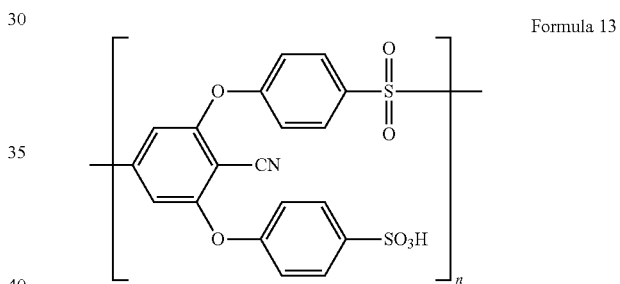

wherein n is an integer between 50 and 1,000.

The high dielectric constant insulator dispersed in the hyperbranched polymer is a nanometer-scale material having a dielectric constant of 90-130 $\epsilon_r$ and a size of 20-30 nm. Specific examples of the high dielectric constant insulator include barium strontium titanate, barium zirconium titanate, barium titanate, lead zirconium titanate, lead lanthanum titanate, strontium titanate, bismuth titanate, barium magnesium fluoride, tantalum pentoxide, titanium dioxide, yttrium trioxide, aluminum trioxide, and silicon nitride.

Figure 2:
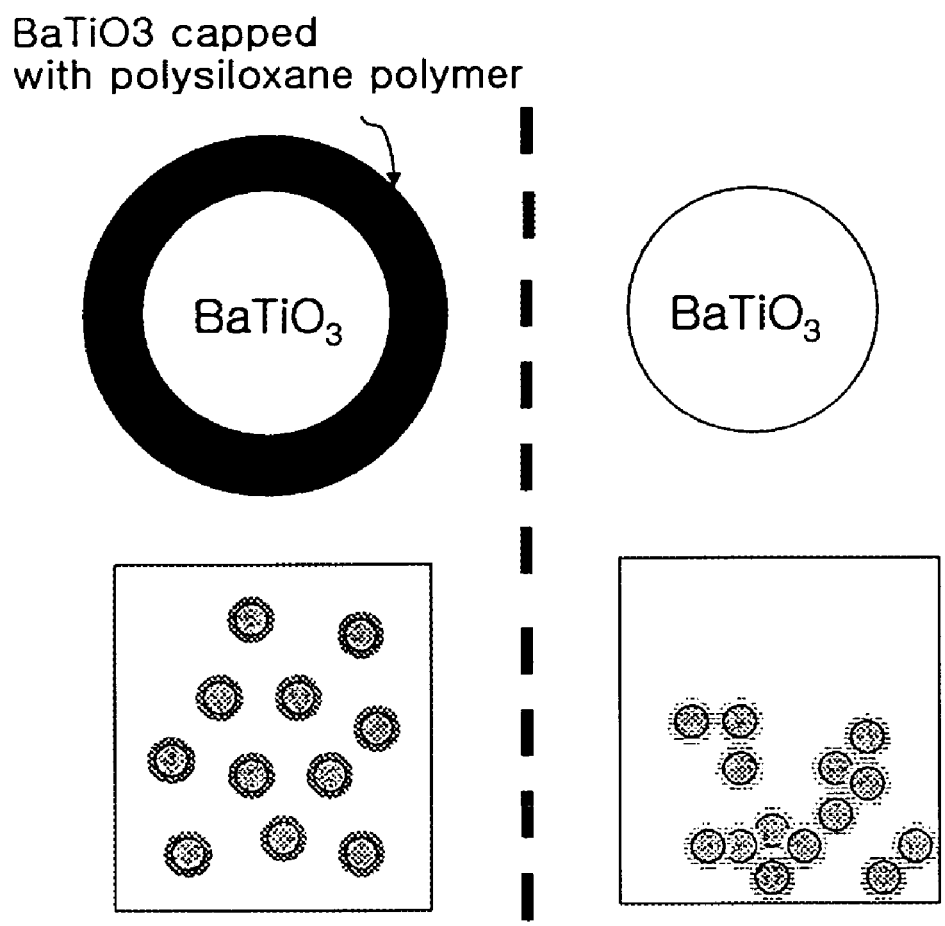
FIG. 2 shows diagrams comparing states where the surface of a high dielectric constant insulator is capped and uncapped with a polysiloxane polymer.

On the other hand, FIG. 2 shows diagrams comparing states where the surface of a high dielectric constant insulator is capped and uncapped with a polysiloxane polymer as the hyperbranched polymer. As shown in FIG. 2, since the high dielectric constant insulator is surface-capped with the polysiloxane polymer of Formula 1, the insulator is prevented from aggregation with other insulators, thus making a more uniform coating of the insulator composition possible. If the insulator is not surface-capped with the polysiloxane polymer, it tends to aggregate with other insulators in a solution, causing non-uniform coating of the insulator composition.

In addition to the high dielectric constant insulator dispersed in the polysiloxane polymer of Formula 1 or the hyperbranched polymer of any one of Formula 3 to 13, the insulator composition of embodiments of the present invention may further comprise an organic insulator material selected from, but not limited to, polyimides, benzocyclobutenes, parylenes, polyacrylates, polyvinylbutyrals, and polyvinylphenols.

Figure 3:
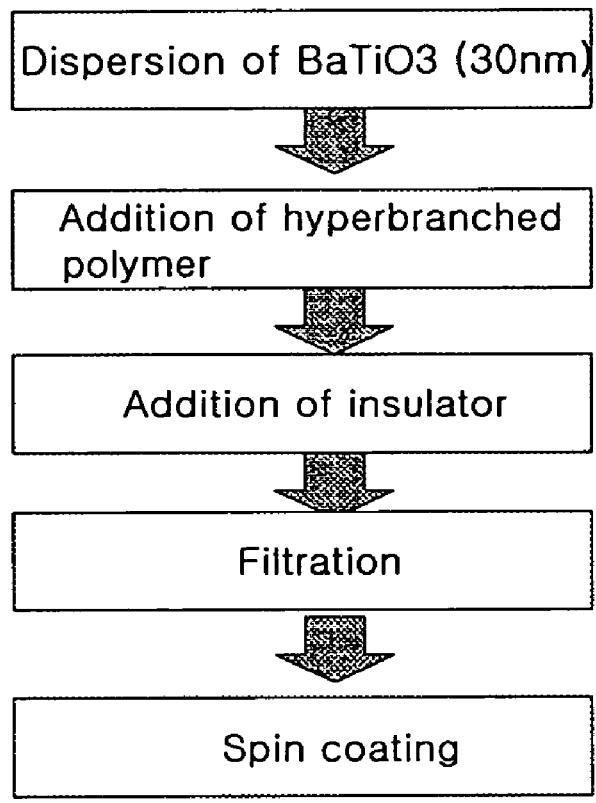
FIG. 3 is a flow chart schematically illustrating the formation of a gate insulating layer of an organic thin film transistor according to one embodiment of the present invention.

FIG. 3 is a flow chart schematically illustrating the formation of a gate insulating layer of an organic thin film transistor according to one embodiment of the present invention. Referring to FIG. 3, the high dielectric constant insulator is preferably introduced into cyclohexanone, and then the hyperbranched polymer is added thereto so that the surface of the insulator is capped with the polymer. At this time, the hyperbranched polymer is preferably added in an amount of 0.5-10% by weight, based on the weight of the insulator. Thereafter, the organic insulator material is mixed, passed through a filter (size: ca. 0.45 μm), and then the filtrate is coated by spin coating to form the insulating layer.

As the organic insulator material, particularly preferred is a polystyrene-maleimide copolymer of Formula 14 below:

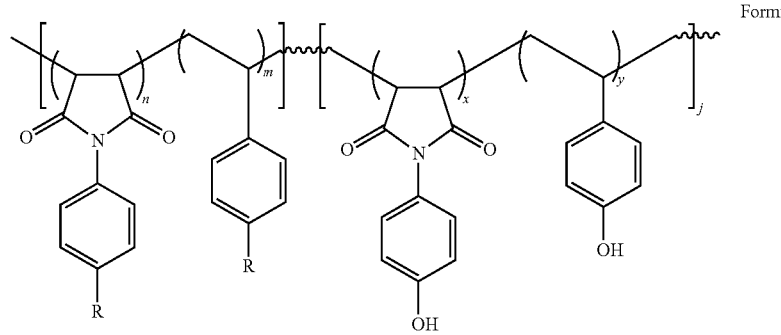

Formula 14 wherein R is selected from the group consisting of hydrogen, halogen, nitro, substituted or unsubstituted amino, cyano, substituted or unsubstituted $C_1$-$C_{30}$ alkyl, substituted or unsubstituted $C_1$-$C_{33}$ alkoxy, substituted or unsubstituted $C_6$-$C_{30}$ aryl, substituted or unsubstituted $C_6$-$C_{30}$ arylalkyl, substituted or unsubstituted $C_6$-$C_{30}$ aryloxy, substituted or unsubstituted $C_2$-$C_{30}$ heteroaryl, substituted or unsubstituted $C_2$-$C_{30}$ heteroarylalkyl, substituted or unsubstituted $C_2$-$C_{30}$ heteroaryloxy, substituted or unsubstituted $C_6$-$C_{20}$ cycloalkyl, substituted or unsubstituted $C_5$-$C_{30}$ heterocycloalkyl, substituted or unsubstituted $C_1$-$C_{33}$ alkylester, and substituted or unsubstituted $C_6$-$C_{30}$ arylester, m and n are each a real number between 0.3 and 0.7, the sum of m and n being 1, x and y are each a real number between 0.3 and 0.7, the sum of x and y being 1, and i and j are each a real number between 0 and 1, the sum of i and j being 1.

The gate insulating layer may be formed into a thin film by screen printing, printing, dipping, ink spraying, or laser deposition, in addition to spin coating.

The organic thin film transistor of embodiments of the present invention may have a structure of substrate/gate electrode/gate insulating layer/organic semiconductor layer/source-drain electrodes, substrate/gate electrode/gate insulating layer/source-drain electrodes/organic semiconductor layer, and the like, but is not limited to these structures.

Examples of suitable materials for the organic semiconductor layer include, but are not limited to, pentacenes, copper phthalocyanines, polythiophenes, polyanilines, polyacetylenes, polypyrroles, polyphenylene vinylenes, and derivatives thereof.

The substrate can be formed of, but not limited to, glass, polyethylenenaphthalate (PEN), polyethyleneterephthalate (PET), polycarbonate, polyvinylbutyral, polyacrylate, polyimide, polynorbornene, polyethersulfone (PES), and the like.

Suitable materials for the gate electrode and the source/drain electrodes are metals or electrically conductive polymers commonly used in the art, and their specific examples include, but are not limited to, gold (Au), silver (Ag), aluminum (Al), nickel (Ni), indium-tin oxides (ITO), molybdenum (Mo), and tungsten (W).

Embodiments of the present invention will now be described in more detail with reference to the following examples. However, these examples are given for the purpose of illustration and are not to be construed as limiting the scope of the invention.

Preparative Example 1

Preparation of Gate Insulator Composition 10 g of $BaTiO_3$ (size: 30 nm) was put in 100 g of cyclohexanone, and then 1 g of the polysiloxane polymer (wherein m is 100, and $R_1$ is phenyl) of Formula 1 was added thereto. Thereafter, 1 g of the polystyrene/maleimide of Formula 14 (wherein x=0.5, y=0.5, i=0, and j=1) was mixed, and passed through a 0.45 μm filter to prepare an insulator composition.

Example 1

Fabrication of OTFT

First, aluminum was deposited on a clean glass substrate to a thickness of 1,000 Å by a sputtering process to form a gate electrode. Thereafter, the insulator composition prepared in Preparative Example 1 was coated on the gate electrode by a spin coating process, and was then dried at 150° C. for one hour. Pentacene was deposited on the dried structure to a thickness of 700 Å under a vacuum of $2\times10^{-7}$ torr, a substrate temperature of 50° C. and a deposition rate of 0.85 Å/sec by a thermal evaporation process, and then gold (Au) was deposited thereon to a thickness of 500 Å by sputtering to fabricate a top-contact OTFT.

Comparative Example 1

An organic thin film transistor was fabricated in the same manner as in Example 1, except that the copolymer of Formula 14 alone was used to form a gate insulating layer.

Evaluation of Electrical Properties of OTFTs

Figure 4:
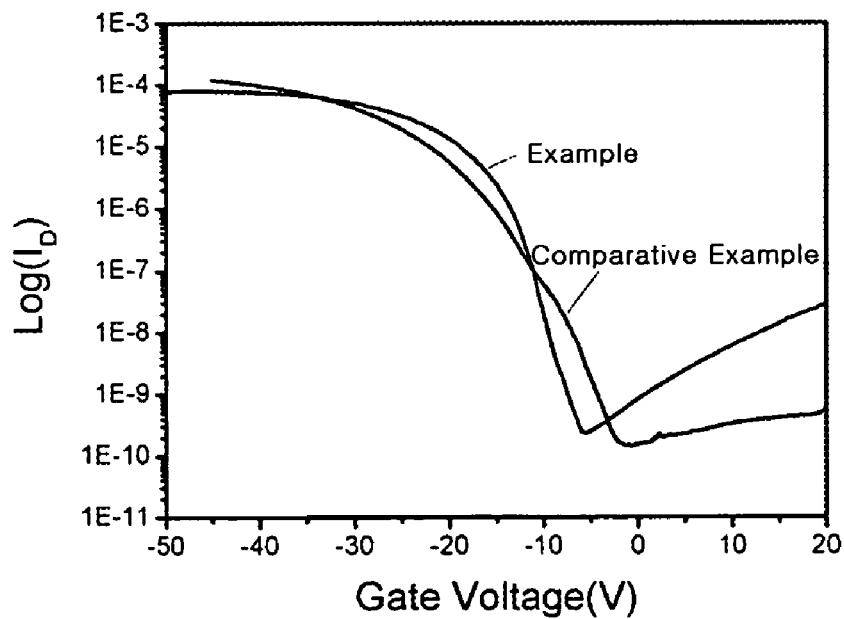
FIG. 4 is a graph comparing the current transfer characteristics of organic thin film transistors fabricated in Example 1 and Comparative Example 1 of the present disclosure.

The current transfer characteristics of the devices fabricated in Example 1 and Comparative Example 1 were measured using a semiconductor characterization system (4200-SCS, KEITHLEY), and the obtained curves were plotted (FIG. 4). The measured values are shown in Table 1. The charge carrier mobility of the devices was calculated using the respective curves from the following current equations in the saturation region.

The charge carrier mobility was calculated from the slope of a graph representing the relationship between $(I_{SD})^{1/2}$ and $V_G$ from the following current equations in the saturation region:

$$I_{SD} = \frac{WC_0}{2L}\mu(V_G - V_T)^2$$

-continued $$\sqrt{I_{SD}} = \sqrt{\frac{\mu C_0 W}{2L}}\,(V_G - V_T)$$

$$\text{slope} = \sqrt{\frac{\mu C_0 W}{2L}}$$

$$\mu_{FET} = (\text{slope})^2 \frac{2L}{C_0 W}$$

In the above equations, $I_{SD}$: source-drain current, $\mu$ and $\mu_{FET}$: charge carrier mobility, $C_o$: capacitance of the oxide film, W: channel width, L: channel length; $V_G$: gate voltage, and $V_T$: threshold voltage.

TABLE 1

| Gate insulating layer | Charge carrier mobility (cm²/Vs) | Threshold voltage (V) |
|---|---|---|
| Example 1 | 1.5 | −10 |
| Comparative Example 1 | 4.5 | −15 |

As can be seen from the data shown in Table 1, the organic thin film transistor of embodiments of the present invention was measured to have a decreased threshold voltage of −10 V and a low charge carrier mobility of 1.5 cm²/Vs. This is because the gate insulating layer was formed of the organic insulator composition comprising the high dielectric constant organic dispersed in the hyperbranched polymer, and thus its dielectric constant was increased.

As apparent from the above description, the use of the insulator composition according to embodiments of the present invention in the formation of a gate insulating layer allows the uniform gate insulating layer to be uniformly formed by spin coating at room temperature, as well as enables fabrication of an organic thin film transistor simultaneously satisfying the requirements of high charge carrier mobility and low threshold voltage.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An organic insulator composition comprising a high dielectric constant insulator covered with a hyperbranched polymer, wherein the hyperbranched polymer is selected from materials of Formulas 1, 3 to 5, and 7 to 11 below:

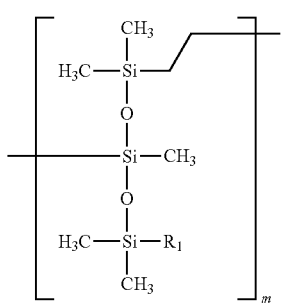

(1)

wherein m is an integer from 50 to 1,000, and $R_1$ contains an aryl group;

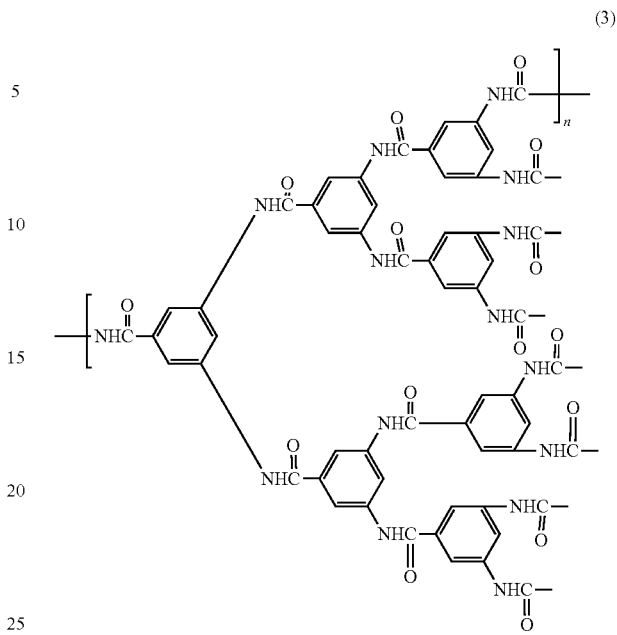

(3)

wherein n is an integer between 50 and 1,000;

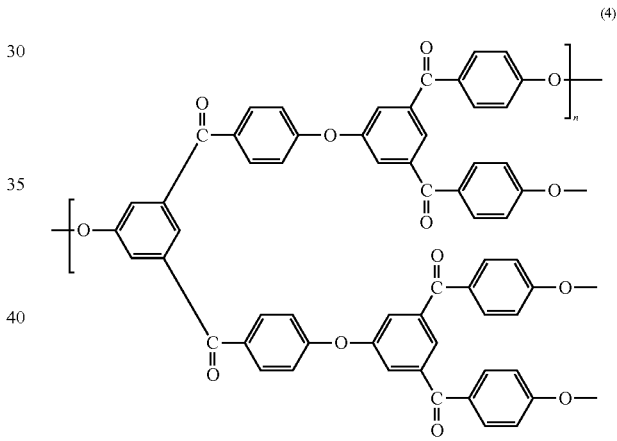

(4)

wherein n is an integer between 50 and 1,000;

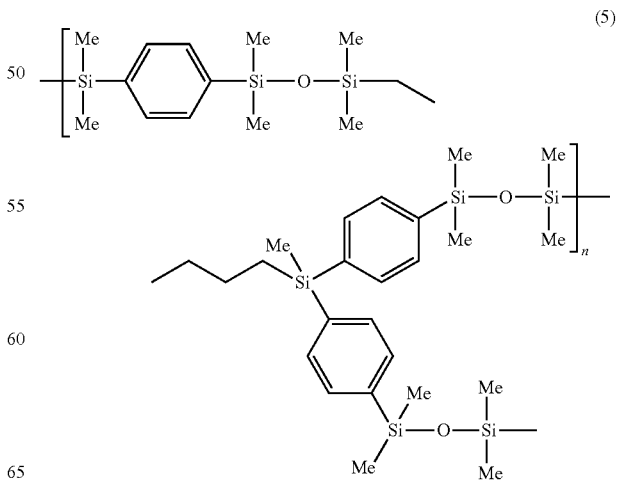

(5)

wherein n is an integer between 50 and 1,000;

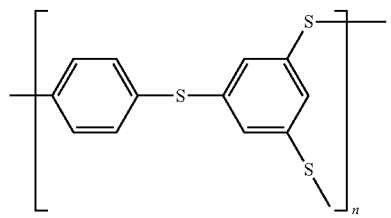

(7)

wherein n is an integer between 50 and 1,000;

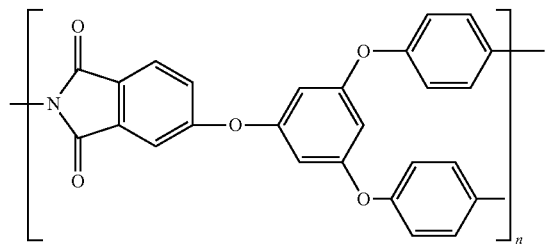

(8)

wherein n is an integer between 50 and 1,000;

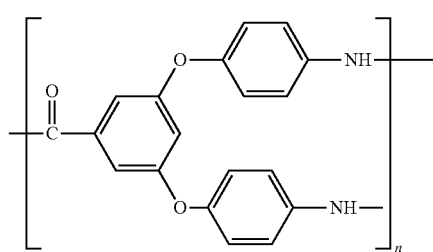

(9)

wherein n is an integer between 50 and 1,000;

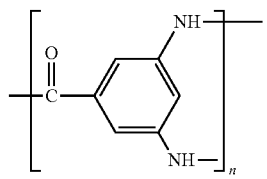

(10)

wherein n is an integer between 50 and 1,000; and (11)

wherein n is an integer between 50 and 1,000.

2. The composition according to claim 1, wherein the high dielectric constant insulator has a dielectric constant of 90-130 $\epsilon_r$ and a size of 20-30 nm.

3. The composition according to claim 1, wherein the high dielectric constant insulator is selected from the group consisting of barium strontium titanate, barium zirconium titanate, lead zirconium titanate, barium titanate, lead lanthanum titanate, strontium titanate, bismuth titanate, barium magnesium fluoride, tantalum pentoxide, titanium dioxide, yttrium trioxide, aluminum trioxide, and silicon nitride.

4. The composition according to claim 1, wherein the surface of the high dielectric constant insulator is capped with the hyperbranched polymer.

5. The composition according to claim 1, wherein the hyperbranched polymer is added in an amount of 0.5-10% by weight, based on the weight of the high dielectric constant insulator.

6. The composition according to claim 1, further comprising an organic insulator selected from polyimides, benzocyclobutenes, parylenes, polyacrylates, polyvinylbutyrals, and polyvinylphenols.

7. The composition according to claim 6, wherein the organic insulator is represented by Formula 14:

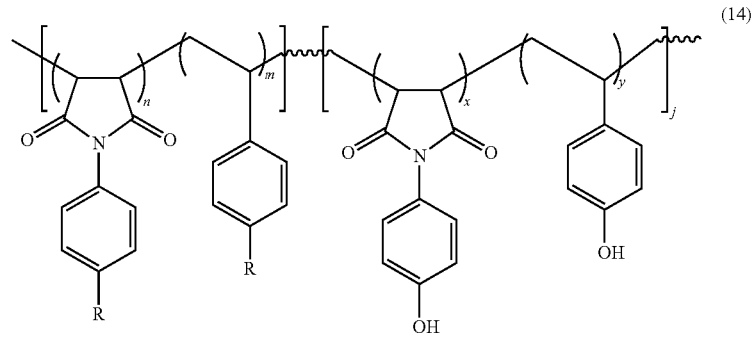

(14)

wherein R is selected from the group consisting of hydrogen, halogen, nitro, substituted or unsubstituted amino, cyano, substituted or unsubstituted $C_1$-$C_{30}$ alkyl, substituted or unsubstituted $C_1$-$C_{30}$ alkoxy, substituted or unsubstituted $C_6$-$C_{30}$ aryl, substituted or unsubstituted $C_6$-$C_{30}$ arylalkyl, substituted or unsubstituted $C_6$-$C_{30}$ aryloxy, substituted or unsubstituted $C_2$-$C_{30}$ heteroaryl, substituted or unsubstituted $C_2$-$C_{30}$ heteroarylalkyl, substituted or unsubstituted $C_2$-$C_{30}$ heteroaryloxy, substituted or unsubstituted $C_5$-$C_{20}$ cycloalkyl, substituted or unsubstituted $C_5$-$C_{30}$ heterocycloalkyl, substituted or unsubstituted $C_1$-$C_{30}$ arylester, and substituted or unsubstituted $C_6$-$C_{30}$ arylester, m and n are each a real number between 0.3 and 0.7, the sum of m and n being 1, x and y are each a real number between 0.3 and 0.7, the sum of x and y being 1, and i and j are each a real number between 0 and 1, the sum of i and j being 1.

8. An organic thin film transistor comprising a substrate, a gate electrode, a gate insulating layer, a source electrode, a drain electrode and an organic semiconductor layer wherein the gate insulating layer is made of the organic insulator composition according to claim 1.

9. The transistor according to claim 8, wherein the substrate is made of a material selected from the group consisting of glass, polyethylenenaphthalate, polyethyleneterephthalate, polycarbonate, polyvinylbutyral, polyacrylate, polyimide, polynorbornene, and polyethersulfone.

10. The transistor according to claim 8, wherein the gate electrode and source-drain electrodes are made of a material selected from the group consisting of gold, silver, aluminum, nickel, indium tin oxide, and molybdenum/tungsten.

11. The transistor according to claim 8, wherein the organic semiconductor layer is made of a material selected from the group consisting of pentacenes, copper phthalocyanines, polythiophenes, polyanilines, polyacetylenes, polypyrroles, polyphenylene vinylenes, and derivatives thereof.

12. The transistor according to claim 8, wherein the gate insulating layer is formed into a thin film by screen printing, printing, spin coating, dipping, ink spraying, or laser deposition.

* * * * *